United States Patent [19]
Wei et al.

[11] Patent Number: 5,156,986
[45] Date of Patent: Oct. 20, 1992

[54] POSITIVE CONTROL OF THE SOURCE/DRAIN-GATE OVERLAP IN SELF-ALIGNED TFTS VIA A TOP HAT GATE ELECTRODE CONFIGURATION

[75] Inventors: Ching-Yeu Wei; George E. Possin; Robert F. Kwasnick, all of Schenectady, N.Y.

[73] Assignee: General Electric Company, Schenectady, N.Y.

[21] Appl. No.: 667,149

[22] Filed: Mar. 11, 1991

Related U.S. Application Data

[62] Division of Ser. No. 593,423, Oct. 5, 1990, abandoned.

[51] Int. Cl.$^5$ .................. H01L 21/336; H01L 21/28
[52] U.S. Cl. ........................ 437/40; 437/44; 437/101; 437/909; 357/23.7
[58] Field of Search ............ 437/40, 41, 44, 101, 437/245, 246, 228, 909; 156/649, 656, 667; 357/4, 23.7, 2

[56] References Cited

U.S. PATENT DOCUMENTS

| | | | |
|---|---|---|---|
| 4,651,185 | 3/1987 | Holmberg et al. | 357/23.7 |
| 4,700,458 | 10/1987 | Suzuki et al. | 437/83 |
| 4,767,723 | 8/1988 | Hinsberg, III et al. | 437/41 |
| 4,862,234 | 8/1989 | Koden | 357/23.7 |
| 4,906,589 | 3/1990 | Chao | 437/233 |
| 4,963,504 | 10/1990 | Huang | 437/233 |
| 4,978,626 | 12/1990 | Poon et al. | 437/233 |
| 5,010,027 | 4/1991 | Possin et al. | 437/41 |
| 5,015,599 | 5/1991 | Verhaar | 437/233 |
| 5,032,531 | 7/1991 | Tsutsui et al. | 357/23.7 |
| 5,032,536 | 7/1991 | Oritsuki et al. | 357/23.7 |
| 5,036,370 | 7/1991 | Miyago et al. | 357/4 |
| 5,068,699 | 11/1991 | Chang | 357/4 |

FOREIGN PATENT DOCUMENTS

| | | | |
|---|---|---|---|
| 0239580 | 10/1987 | Japan | 357/4 |
| 0173340 | 7/1988 | Japan | 437/44 |
| 0120068 | 5/1989 | Japan | 357/23.7 |
| 0133371 | 5/1989 | Japan | 437/44 |
| 0209764 | 8/1989 | Japan | 357/23.7 |

OTHER PUBLICATIONS

Wolf et al., *Silicon Processing for the VLSI Era*, vol. 1 *Process Technology*, Lattice Press 1986, p. 558.

T. Kodama et al., A Self-Alignment Process for Amorphous Silicon Thin Film Transistors, IEEE Electron Device Letters, vol. EDL-3, No. 7, Jul. 1982.

K. Asama et al., A Self-Alignment Process a-Si TFT Matrix Circuit for LCD Panels, Fujitsu, Laboratories, Ltd., Atsugi, Japan, SID Digest, 1983.

S. Nisha et al., A New Self-Aligned A-Si TFT Using Ion Doping and Chromium Silicide Formation, #A6.1, Symposia Abstracts for Materials Research Society, 1991, Spring Meeting, p. 32.

*Primary Examiner*—Mary Wilczewski
*Attorney, Agent, or Firm*—Donald S. Ingraham; James C. Davis, Jr.; Marvin Snyder

[57] ABSTRACT

Positive control over the length of the overlap between the gate electrode and the source and drain electrodes in a thin film transistor is provided by a gate conductor layer comprising two different conductors having differing etching characteristics. As part of the gate conductor pattern definition process, both gate conductors are etched to expose the underlying material and the upper gate conductor layer is etched back to expose the first gate conductor layer in accordance with the desired overlap between the gate electrode and the source and drain electrodes. Thereafter, the remainder of the device is fabricated with the source and drain electrodes self-aligned with respect to the second gate conductor layer using a planarization and non-selective etch method.

13 Claims, 15 Drawing Sheets

POSITIVE CONTROL OF THE SOURCE/DRAIN-GATE OVERLAP IN SELF-ALIGNED TFTS VIA A TOP HAT GATE ELECTRODE CONFIGURATION

This application is a division of application Ser. No. 07/593,423, filed Oct. 5, 1990, now abandoned.

RELATED APPLICATIONS

The present application is related to application Ser. No. 07/593,419, filed Oct. 5, 1990, entitled, "Thin Film Transistor Structure With Improved Source/Drain Contacts", by R. F Kwasnick, et al.; application Ser. No. 07/593,425, filed Oct. 5, 1990, entitled "Device Self-Alignment by Propagation of a Reference Structure's Topography", by C-Y Wei, et al.; application Ser. No. 07/593,421, filed Oct. 5, 1990, entitled, "Thin Film Transistor Having an Improved Gate Structure and Gate Coverage by the Gate Dielectric" by R. F. Kwasnick, et al.; application Ser. No. 07/510,767, filed Apr. 17, 1990, entitled "Method for Photolithographically Forming a Self-Aligned Mask Using Back Side Exposure and a Non-Specular Reflecting Layer", by G. E. Possin, et al.; and application Ser. No. 07/499,733, filed Mar. 21, 1990, entitled "Method for Fabricating a Self-Aligned Thin-Film Transistor Utilizing Planarization and Back-Side Photoresist Exposure", by G. E. Possin, et al., now U.S. Pat. No. 5,010,027, each of which is incorporated herein by reference.

BACKGROUND OF THE INVENTION

Field of the Invention

The present invention relates to the field of fabrication techniques for thin film transistors, and more particularly to techniques for self-aligned fabrication of thin film transistors.

Background Information

Thin film transistors (TFTs) are employed in liquid crystal displays and imagers to control or sense the state of each pixel of the display or image. At present, such thin film transistors are typically fabricated from amorphous silicon. In such display or sensor systems, system operating characteristics are optimized by making each cell or pixel have substantially identical operating characteristics. These operating characteristics include switching speed, capacitive loading of drive and sense lines, the gain of transistors and so forth.

One of the processing problems which causes variation in the characteristics of different cells within such structures is the inability to accurately align the position of a mask which defines the source and drain electrodes of thin film transistors in a manner which ensures that the source/drain electrodes are accurately aligned with respect to the gate electrodes. Misalignment results in an increase in the overlap between the gate electrode and either the source electrode or the drain electrode with a corresponding decrease in the overlap between the gate and the other of them. Since the capacitances between the gate electrode and the source or drain electrodes are direct functions of the overlap between them, such a change in overlap produces a change in device's capacitances and consequently, switching speed and loading of other circuits. The possibility of misalignment requires that the size of the gate metal be increased to ensure that all devices have acceptable overlap between the gate and the source and drain. This increases the device size and hence the total capacitance per device. The device capacitance is important because it controls the charging time of the gate electrodes, the capacitive coupling between the gate and the source and drain nodes, and the noise introduced by the defects in the amorphous silicon or at the amorphous silicon/dielectric interface. Consequently, there is a desire to provide self-alignment between the source and drain electrodes and the gate electrode in order to maintain a fixed, predictable overlap between the gate electrode and each of the source and drain electrodes across an entire wafer.

A variety of self-alignment techniques have been proposed or developed. The above-identified related applications Ser. Nos. 07/499,733 and 07/510,767 each disclose techniques for obtaining self-alignment between the gate electrode and the source and drain electrodes through the use of through-the-substrate exposure of photoresist. Such processes result in specific gate-to-source and gate-to-drain overlaps which are peculiar to those techniques and the particular manner in which they are carried out. Those overlaps may be smaller or larger than optimum. Such a through-the-substrate exposure technique is not suitable where the semiconductor itself or another device layer would absorb the light needed to expose the photoresist. Consequently, there is a need for other self-alignment techniques for thin film transistors.

Related application Ser. No. 07/593,425 solves these problems by employing mechanical propagation of topographical features of a lower, reference layer, upward through subsequently deposited layers of the structure, including a support layer. A subordinate layer (source/drain metallization) is deposited on the support layer and may be either conformal or not conformal. If necessary, a planarization layer is formed over the subordinate layer to provide a planar upper surface for the structure. Material is then removed from the upper surface in a non-selective, uniform manner until the source/drain metallization becomes exposed in an aperture which is thereby created in the planarization layer in alignment with the underlying reference layer pattern. The exposed portion of the subordinate layer is then selectively etched to expose the support layer. Alternatively, the planarization etch could be continued until the support layer was exposed, but that would result in thinner source and drain electrodes. Other portions of the subordinate layer are then patterned, if necessary and the fabrication of the device completed. The result is a device in which the overlap of the subordinate layer over the reference pattern in the vicinity of the aperture in the subordinate layer is self-aligned with respect to the reference layer pattern.

The technique of application Ser. No. 07/593,425 can provide a very short overlap between the gate electrode and the source and drain electrodes. In particular, an overlap of less than 0.5 μm is achievable. Such a small overlap is desirable from the point of view of minimizing overlap capacitance and capacitance induced noise. Unfortunately, it is found experimentally that there is a minimum overlap between the gate and the source and drain electrodes below which the saturation drain current of a TFT degrades significantly. While the minimum length of this overlap for good device operating characteristics may vary with different semiconductor materials and other variations in the device structure, it would be desirable to have a technique for positively controlling the amount of overlap between the gate electrode and the source and drain electrodes in a self-aligned TFT structure.

OBJECTS OF THE INVENTION

Accordingly, a primary object of the present invention is to provide a technique for positively controlling the length of the overlap between the gate electrode and the source and drain electrodes in a self-aligned thin film transistor.

Another object of the present invention is to increase the versatility of the self-alignment technique disclosed in related application Ser. No. 07/593,425.

Another object of the present invention is to provide a self-alignment method which is applicable to opaque substrates.

SUMMARY OF THE INVENTION

The above and other objects which will become apparent from the specification as a whole, including the drawings, are accomplished in accordance with the present invention by fabricating the gate electrode as two separate layers of different conductors; patterning the entire gate electrode to the desired gate electrode pattern and subsequently etching the second layer of the gate electrode conductor back from the edges of the first level gate electrode conductor in a self-aligned manner whereby positive control of the degree of setback of the tapered edge of the upper layer (thick) gate conductor material from the lower layer (thin) conductor material is provided while retaining self-alignment. In this manner, a self-aligned process which relies on propagation of the topography of the gate electrode through subsequently deposited layers of the structure provides gate-to-source and gate-to-drain electrode overlaps which are controlled by the setback of the second gate conductor layer with respect to the first gate conductor layer in addition to the setback produced by the slope of the tapered second gate conductor layer.

In accordance with one embodiment of the invention, the first and second gate conductor layers are sequentially deposited on a substrate in the same vacuum pumpdown, the gate conductor is photomasked and etched to expose the substrate in the areas where the gate conductor is not desired. Thereafter, the second gate conductor layer is etched back from the edge of the first conductor layer using the same gate mask and an etchant to which the first gate conductor layer is substantially immune and with a technique which tapers the second gate conductor layer to provide lateral edges on that layer which are suitable for the deposition of conformal layers thereover. Thereafter, substantially conformal gate dielectric and semiconductor layers are deposited on the structure followed by patterning of the semiconductor layers and then deposition of source/drain metallization which may be conformal or nonconformal. Where the source/drain metallization does not exhibit a planar upper surface, a planarization layer is deposited on top of the source/drain metallization to provide a planar upper surface for the device structure. The device structure is then etched in a non-selective manner until the source/drain metallization is exposed in alignment with the raised (thick) portion of the gate electrode pattern. The exposed portion of the source/drain metallization is then selectively etched to expose the n+ amorphous silicon which is then removed. Thereafter, back channel passivation may be provided on the upper surface of the structure to minimize the effect of external conditions on the operating characteristics of the device.

The resulting semiconductor device has a setback or top hat gate conductor configuration in which the effective electrical gate width is that of the thin, lower, wider gate conductor layer while the configuration of the thicker, upper, narrower gate conductor layer controls the self-alignment of the source and drain electrodes with respect to the gate electrode and thus the overlap between the source and drain electrodes and the gate electrode.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a perspective, partially cross section view of a substrate having an unpatterned reference layer disposed thereon;

FIG. 2 is a perspective, partially cross section view of the FIG. 1 structure having a patterned layer of photoresist disposed thereon;

FIG. 3 is a perspective, partially cross section view of the FIG. 2 structure following etching of an upper gate conductor layer;

FIG. 4 is a perspective, partially cross section view of the FIG. 3 structure following etching of a lower gate conductor layer;

FIG. 5 is a perspective, partially cross section view the structure following etch back of the upper layer of the gate conductor from the edge of the lower gate conductor;

FIG. 6 is a perspective, partially cross-section view of the FIG. 5 structure following stripping of the retained photoresist;

FIG. 7 is a perspective, partially cross-section view of the FIG. 6 structure following the deposition of a gate insulator thereover;

FIG. 8 is a perspective, partially cross-section view of the structure following the deposition of two layers of semiconductor material;

FIG. 9 is a perspective, partially cross-section view of the FIG. 8 structure after patterning of the layers of semiconductor material;

FIG. 10 is a perspective, partially cross-section view of the structure following the deposition of two layers of source/drain metallization;

FIG. 11 is a perspective, partially cross-section view of the structure following completion of the structure through the formation of a substantially planar surface;

FIG. 12 is a plan view of a portion of the structure;

FIG. 13 is a perspective, partially cross-section view of the structure following uniform removal of enough material from the structure to expose the support layer within an aperture in the subordinate layer;

FIG. 14 is a perspective, partially cross-section view of the FIG. 13 structure following etching of the support layer in the self-aligned openings in the subordinate layer.

DETAILED DESCRIPTION

In accordance with one embodiment of the present invention, an amorphous silicon thin film (TFT) field effect transistor (FET) may be fabricated. Various stages in the fabrication of such a device in accordance with the present invention are illustrated in FIGS. 1-14.

Figure 1:
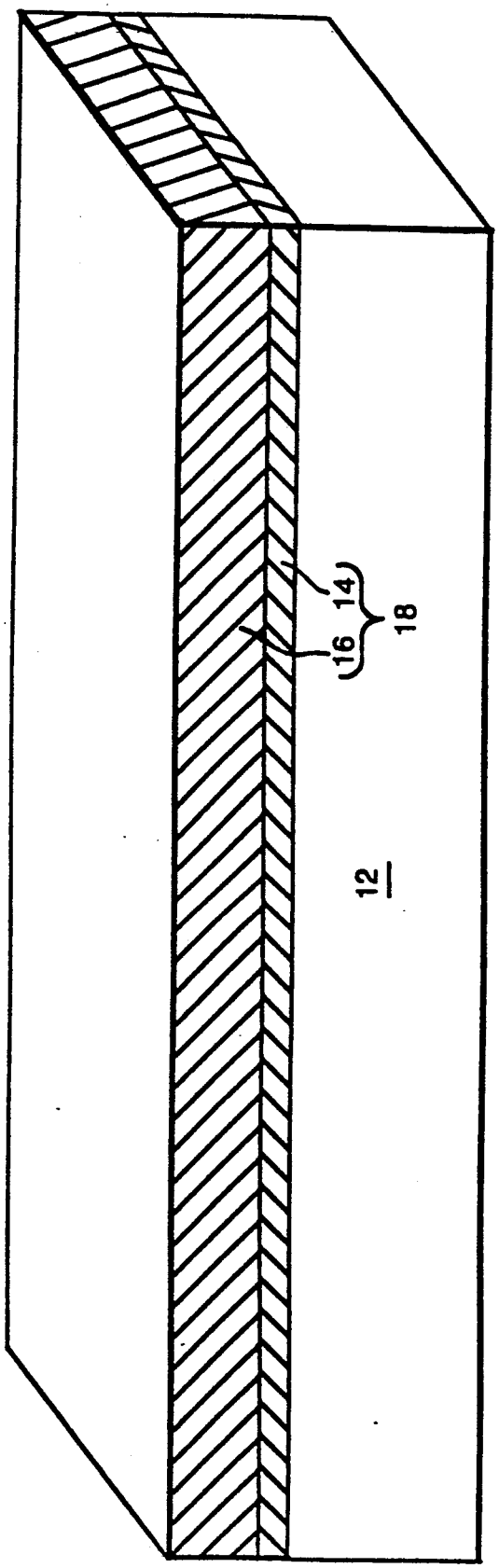
FIGS. 1-14 illustrate successive stages in the fabrication of a thin film transistor in accordance with the present invention.

In FIG. 1, a substrate 12 has a uniform reference layer 18 disposed thereon. Reference layer 18 comprises first and second sublayers 14 and 16. For fabrication of a thin film transistor, the layer 18 constitutes the gate conductor while the substrate 12 constitutes a larger structure on which the transistor is to be disposed. In many applications such as liquid crystal displays and imagers, it is desirable that the substrate 12 be transparent, however, transparency of the substrate is unimportant to the present process and thus, is a matter of design choice in accordance with the intended use of the thin film transistor to be fabricated. Typical transparent substrate materials are glass, quartz and appropriate plastics.

The gate conductor sublayers 14 and 16 are deposited on the substrate in sequence by any appropriate technique such as sputtering, chemical vapor deposition, thermal evaporation and so forth. This gate conductor is comprised of two layers of different metals such as a first layer of titanium disposed in contact with the substrate with a layer of molybdenum or aluminum (referred to as Mo/Ti and Al/Ti metallization, respectively) disposed thereover or a layer of chromium disposed on a substrate with a layer of molybdenum disposed thereover (Mo/Cr metallization). As a further alternative, the first sublayer of the gate conductor may be a transparent conductor material such as indium tin oxide or other transparent conductors. We prefer to use Mo/Cr.

The gate electrode is typically deposited to a thickness of 1,000 Å to 10,000 Å, depending on the sheet resistivity required for the gate electrode structure and the vertical height of the top hat gate required to achieve good self-alignment. With a Mo/Cr gate conductor, the Cr is preferably 100 to 500 Å thick and the Mo is preferably 1000 to 10,000 Å thick.

Figure 2:
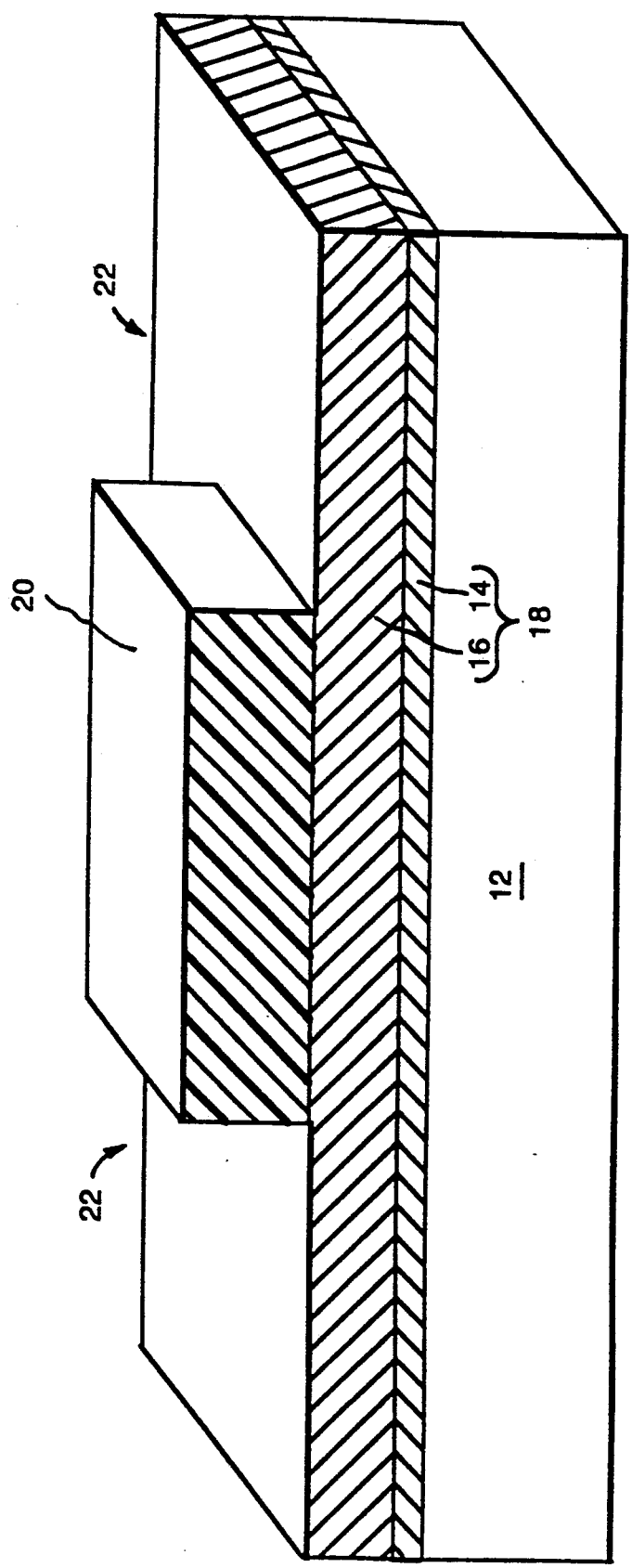

The FIG. 1 structure is then photomasked to provide a mask pattern corresponding to the desired gate conductor configuration as shown in FIG. 2. The upper surface of the second conductor 16 is exposed in the window 22 where the photoresist 20 has not been retained. Next, the structure is dry etched preferably using reactive ion etching to pattern the upper conductor layer 16 in accordance with the retained photoresist pattern. To do this, the wafer is mounted in a reactive ion etching apparatus which is then purged and evacuated in accordance with normal reactive ion etching procedures. A source gas flow preferably of 37.5 sccm (standard cubic centimeters per minute) of sulphur hexafluoride ($SF_6$), 6.5 sccm of $Cl_2$ and 16 sccm of $O_2$ is established, introduced into the etching chamber at a pressure of 65 mtorr and reactive ion etching potentials are applied to etch the molybdenum in the windows 22. This etching is preferably carried out until all the molybdenum is removed in center of the windows and is allowed to proceed for 40 seconds more of overetching to ensure that all of the molybdenum is removed from within the originally defined windows 22. This molybdenum etching step is preferably carried out at a power of 200 watts.

Figure 3:
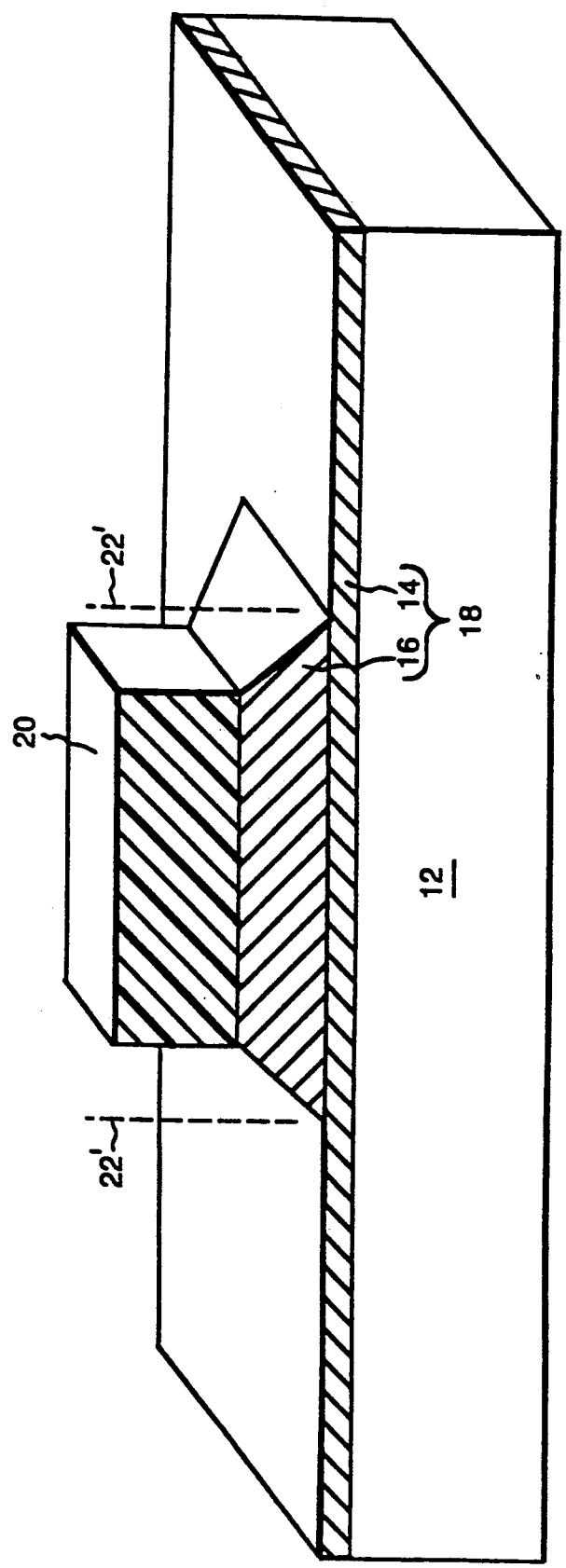

Following this etching step, the structure appears as illustrated in FIG. 3. It will be noted, that the second conductor (molybdenum) has been removed from the structure everywhere outside the region which was initially protected by the retained portion of the photoresist 20. The original edges of the retained photoresist are indicated by the dash lines marked 22', but the photoresist has been etched back from that original edge as the etching of the molybdenum has proceeded. This results in the substantially 45° slope to the side walls of the molybdenum as illustrated in FIG. 3.

A tapered gate electrode of this type may be provided in a variety of other ways well known in the art including reliance on the erosion of the photoresist during etching of the gate conductor where reactive ion etching (RIE) is employed or an isotropic wet etch may be employed which undercuts the resist during etching of the unprotected portion of the gate conductor.

Such a slope is provided in RIE, in part because when the photoresist is baked after patterning to toughen it prior to RIE etching, the photoresist slumps with the result that its thickness tapers from small or zero at the edge of a photoresist region upward to the central thickness of the photoresist over a finite distance. During reactive ion etching, the photoresist erodes as the gate conductor is etched with the result that a taper is produced on the retained portion of the gate conductor.

Figure 4:
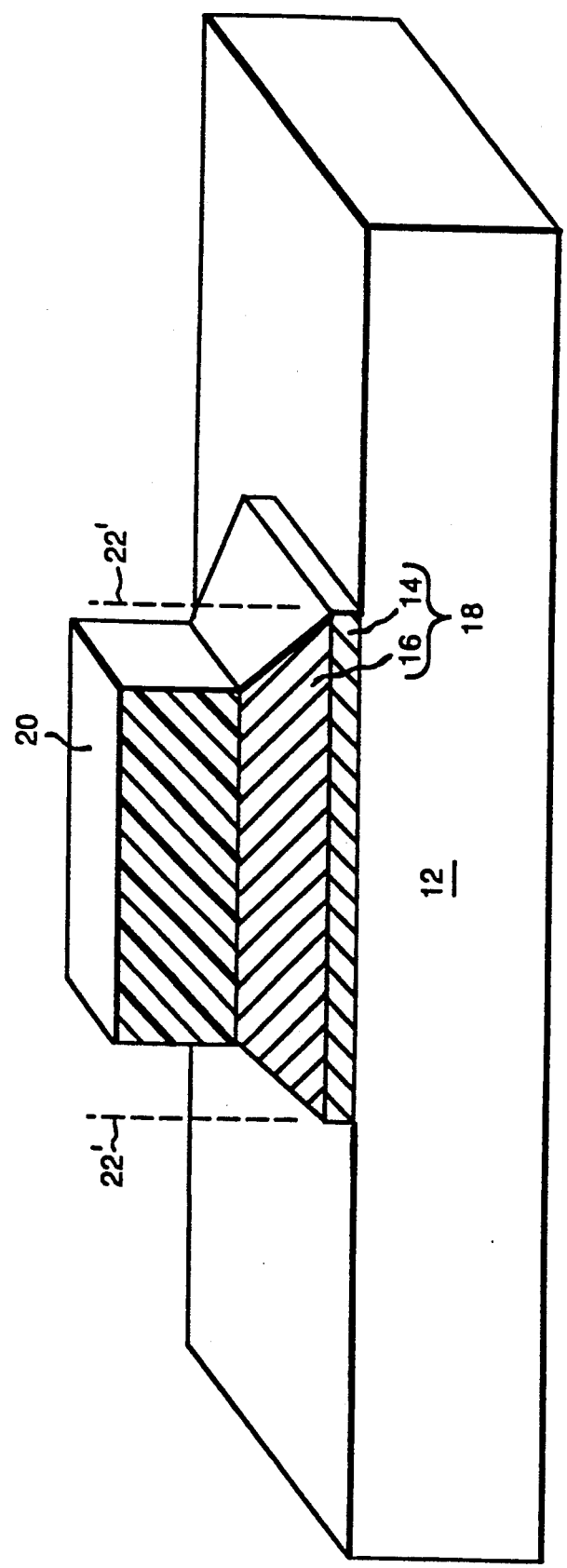

Next, the etching gas is preferably changed to 70 sccm of $Cl_2$ and 30 sccm of $O_2$ at a pressure of 100 mtorr to remove the exposed chromium. This etch is preferably continued until all the exposed chromium appears to have been removed and is then continued for an additional 60 seconds to ensure complete removal of the exposed chromium. The degree of overetching which should be employed depends on the substrate composition and the relative etch rates of the first conductor 14 and the substrate in the etching composition employed. This etching step is preferably carried out at a power of 300 watts. Following this step, the structure appears as illustrated in FIG. 4.

Figure 5:
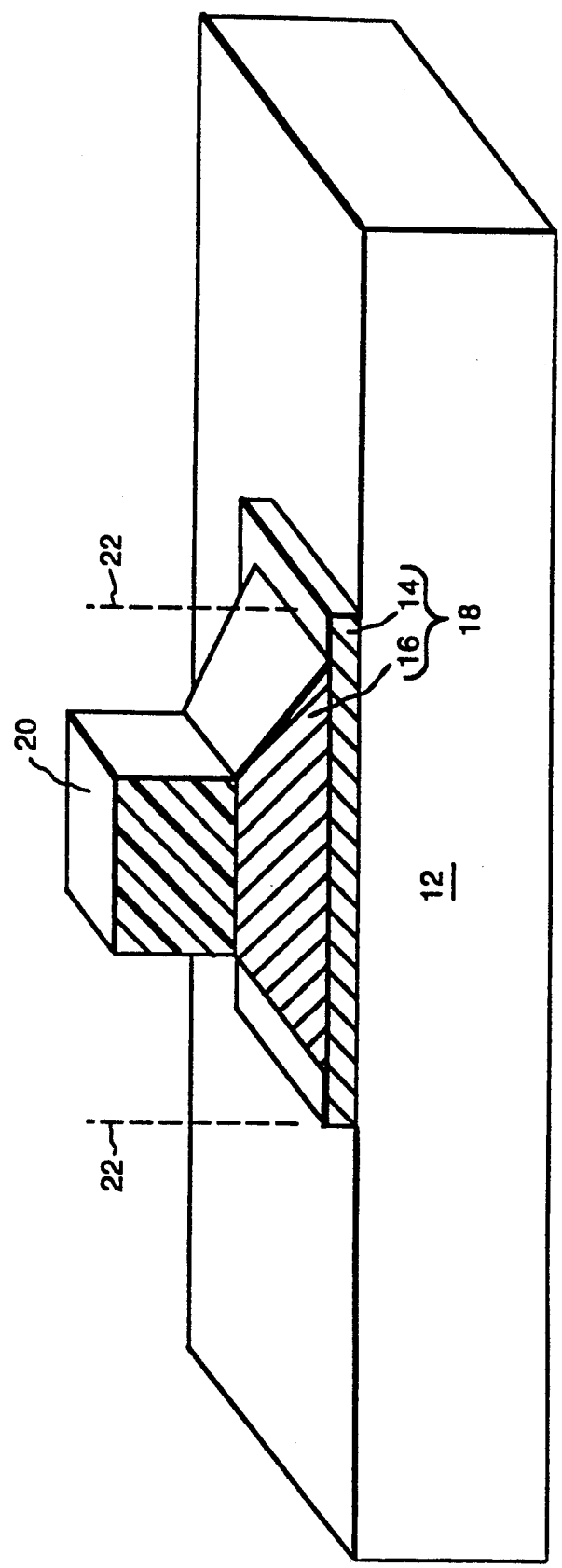

Next, the molybdenum upper layer of the gate conductor is etched back to expose a desired width of the first gate conductor layer. This may be done with the RIE using the same source gases as for the initial etching of the molybdenum, provided that that etchant does not excessively etch the now exposed portion of the substrate where the chromium has been removed. Following this step, the structure appears as illustrated in FIG. 5.

Figure 6:
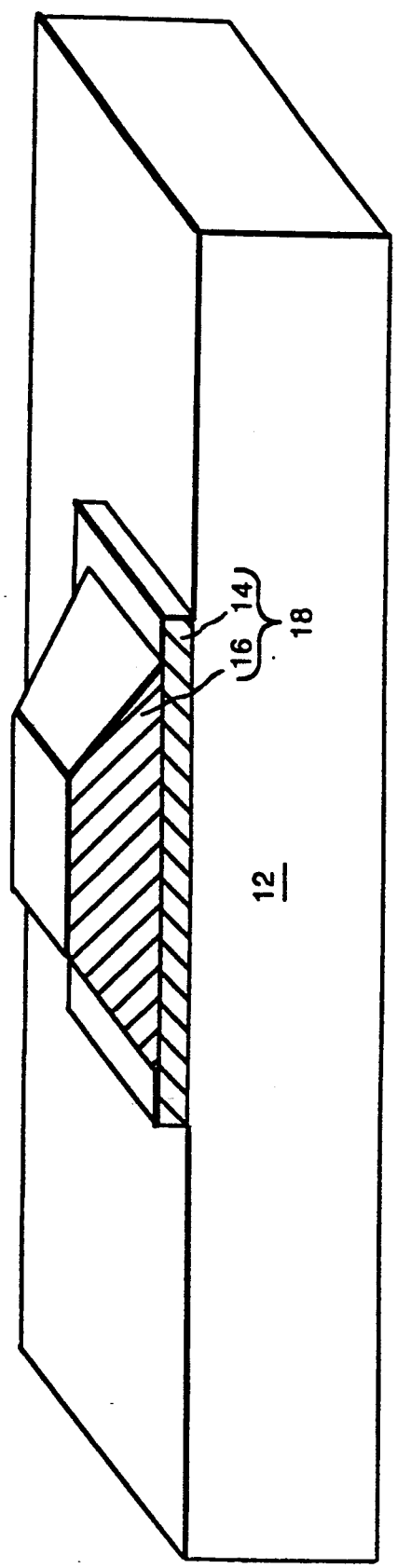

The retained photoresist is then removed to leave the structure illustrated in FIG. 6.

Next, a gate dielectric layer 28 is deposited over the entire structure preferably by chemical vapor deposition or some other process which is known to produce a high integrity dielectric. This gate dielectric is preferably be silicon nitride but may be silicon dioxide or other dielectrics and is about 1,000 to 4000 Å thick. The chromium gate conductor layer 14 is sufficiently thin (10 to 1000 Å) and the sidewall of the molybdenum gate conductor layer 16 is sufficiently vertically inwardly tapered or sloped that a high integrity conformal dielectric layer results.

Figure 7:
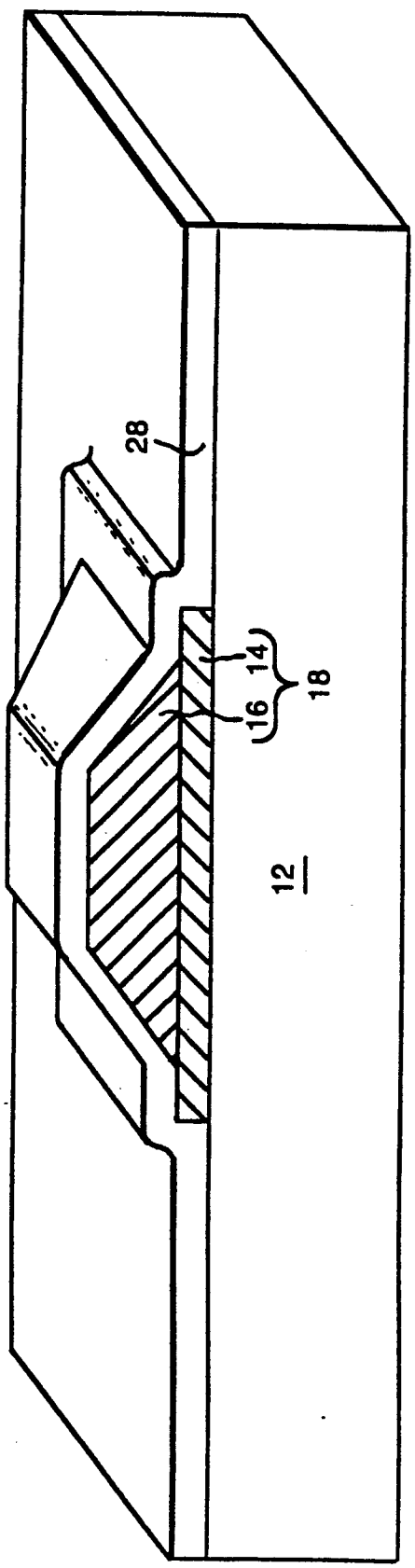
Figure 8:
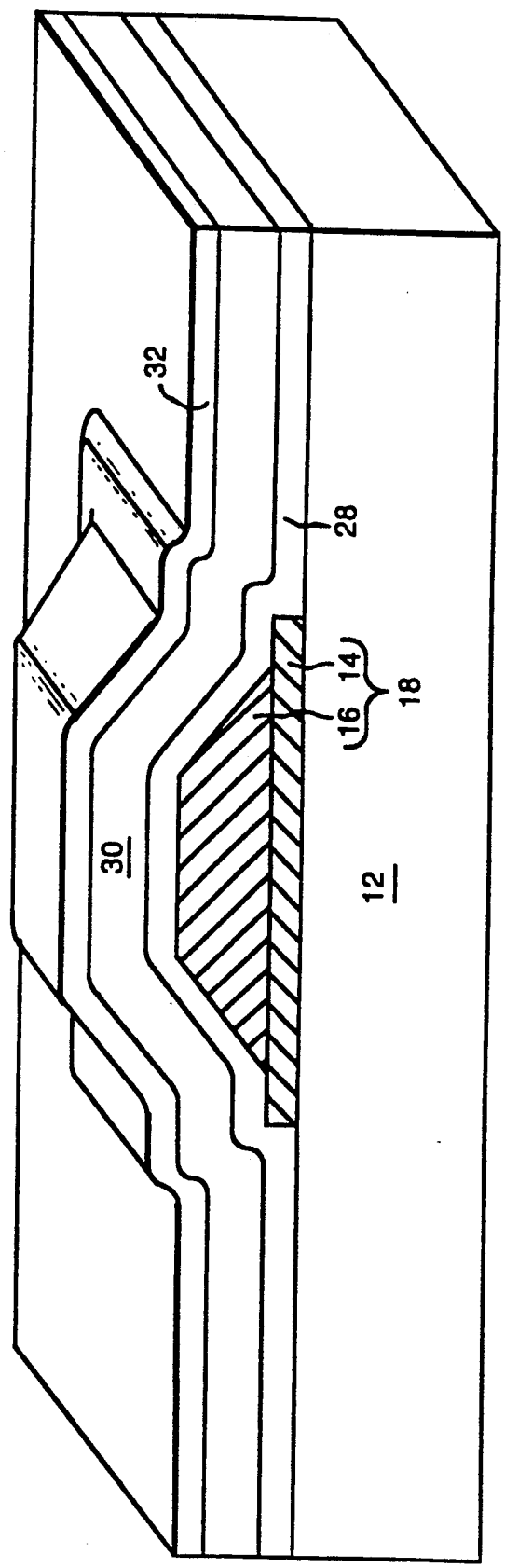

This deposition of gate dielectric on the upper surface of the structure is done in a conformal manner whereby the raised configuration of the patterned gate electrode extends to the upper surface of that gate dielectric layer, that is, the surface topography is essentially unchanged as shown in FIG. 7.

Thereafter, in the fabrication of a typical silicon thin film transistor, a layer 30 of intrinsic amorphous silicon is deposited on the gate dielectric layer in a conformal manner. This intrinsic amorphous silicon layer typically has a thickness on the order of 2,000 Å. A thinner layer 32 (about 500 Å) of doped (typically phosphorous doped, that is n+) amorphous silicon is then deposited on the intrinsic amorphous silicon in a conformal manner to provide the structure illustrated in FIG. 8.

The dielectric layer, the intrinsic amorphous silicon and the doped amorphous silicon may all be deposited in the same deposition chamber without breaking the vacuum. Where that is done, we prefer to stop the plasma discharge in the deposition chamber after the completion of the deposition of a particular layer until after the proper gas composition for the deposition the next layer has been established. We then re-establish the plasma discharge to deposit that new layer. Alternatively, the two silicon depositions may be done in different chambers.

Figure 9:
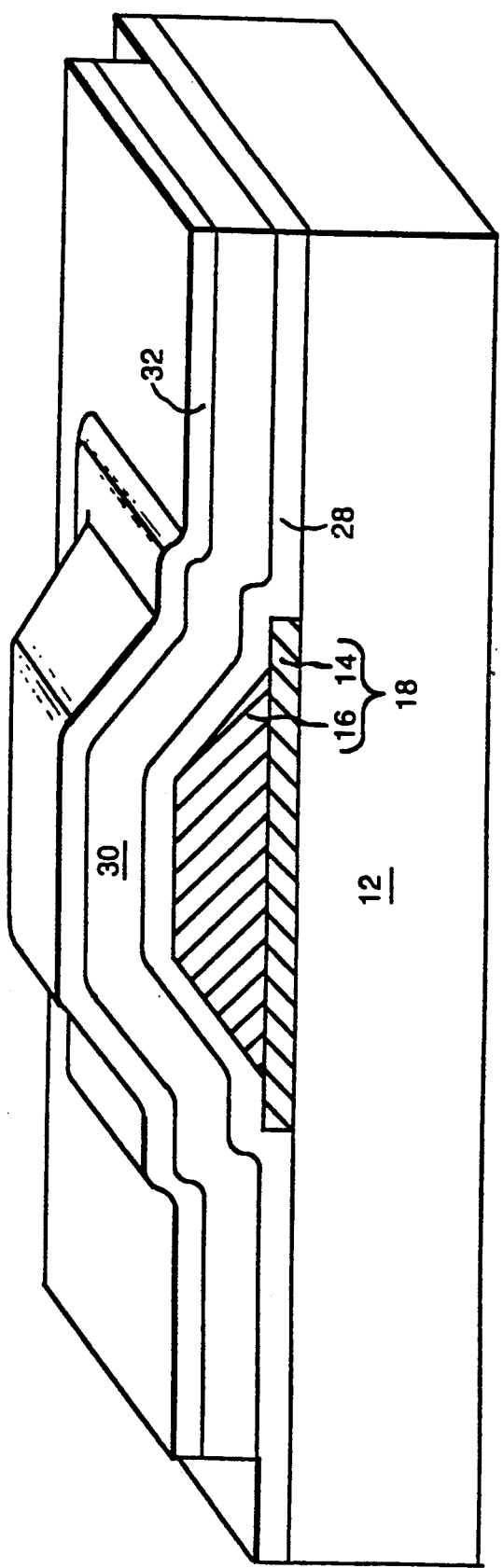

At this stage, the silicon layers may be patterned photolithographically to restrict them to the part of the structure where the silicon is needed, as shown in FIG. 9.

Figure 10:
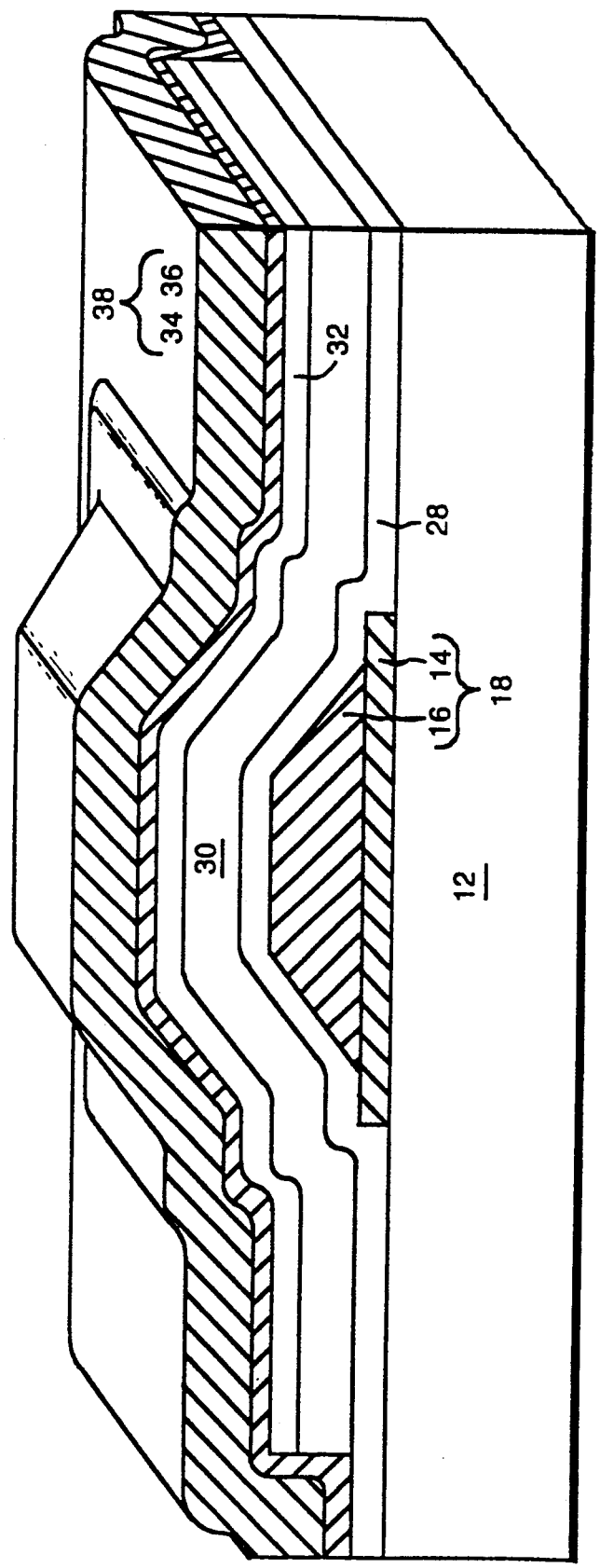

Thereafter, the source/drain metallization is deposited over the structure in a conformal manner. In accordance with application Ser. No. 07/593,419, entitled, "Thin Film Transistor Structure With Improved Source/Drain Contacts", this source/drain metallization is preferably a two layer molybdenum on chromium (Mo/Cr) metallization in which the Cr is 100 to 1000 Å thick and the molybdenum is 1000 to 10,000 Å thick, as shown in FIG. 10. Alternatively, this metallization may be a single metal such as molybdenum, chromium or tungsten. Following this step, the structure appears as illustrated in FIG. 10.

Figure 11:
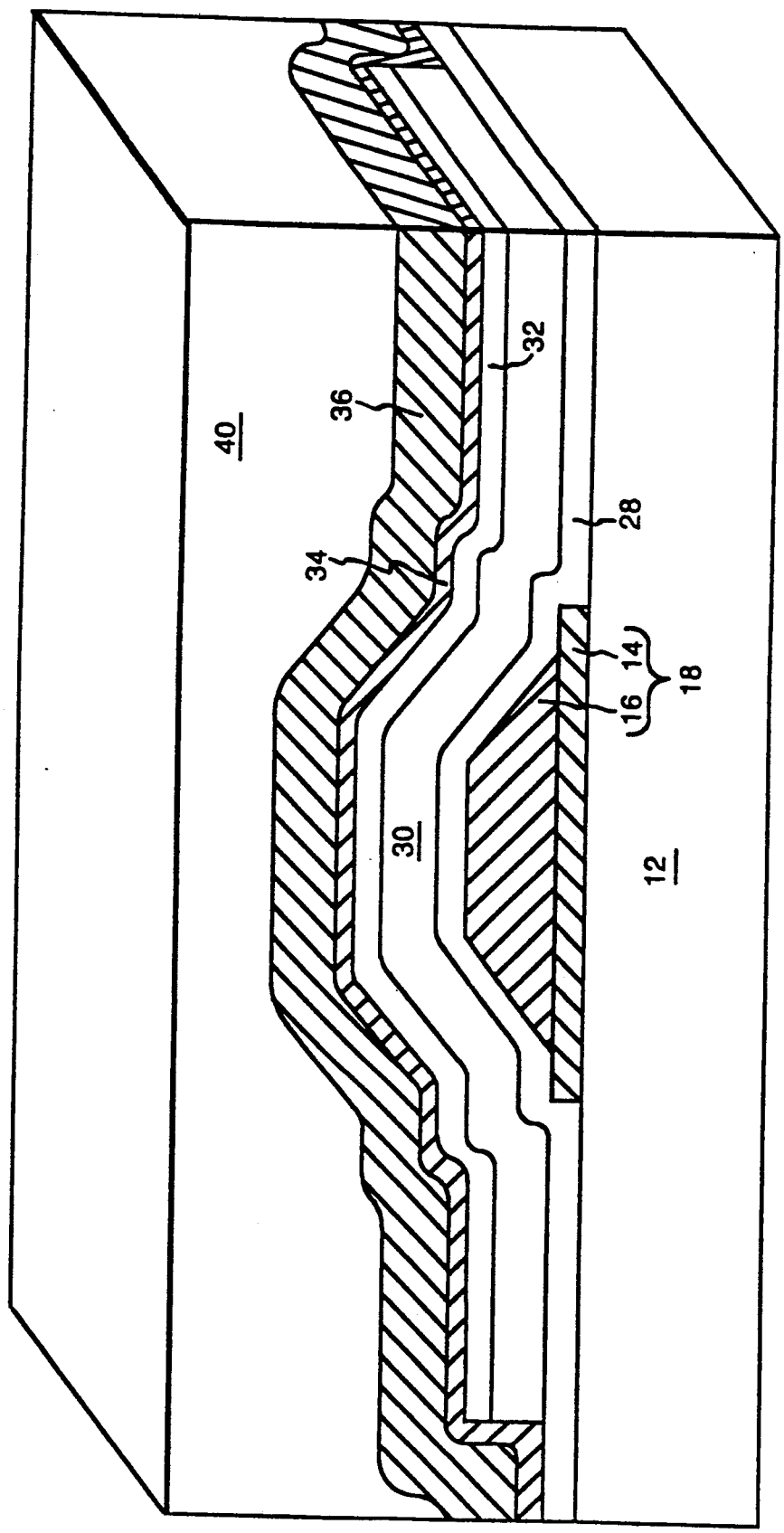

A planarization layer 40 (which may be photoresist) is then formed over the entire structure to provide a substantially planar upper surface of the structure as shown in FIG. 11.

In this manner, the topology of the patterned gate conductor is propagated upward through the various layers, at least through the support layer (the n+ doped amorphous silicon in this example) on which the source/drain metallization is disposed. That propagation of topography could be terminated by the source/drain metallization itself, but is at this time preferably terminated by a separate planarization layer because common metallization deposition processes are substantially conformal in nature and making the source/drain metallization conformal enables the final source and drain electrodes to be thicker.

Figure 12:
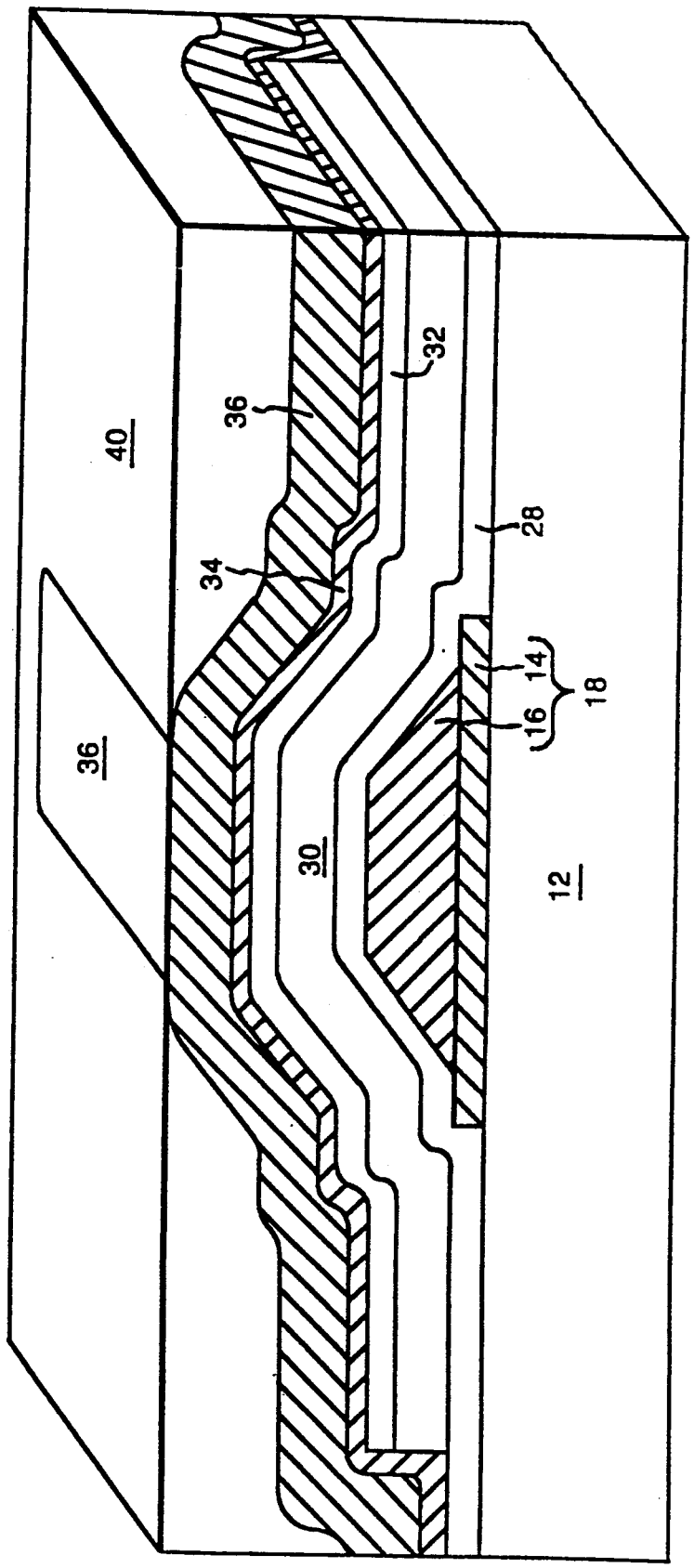

The entire structure is then etched back in a nonselective manner by a planarization reactive ion etch. This planarization etch is preferably stopped once the molybdenum over the gate electrode has been exposed. That exposed molybdenum is then selectively etched with the remaining portion of the planarization layer serving as the etching mask to restrict that etching to the molybdenum which is over the gate electrode. This is followed by etching the now exposed chromium. As illustrated in FIG. 12, a self-aligned overlap between the source and drain electrodes and the gate electrode is produced. Alternatively, the planarization etch may be continued until the chromium layer of the source/drain metallization has been exposed. That exposed chromium 34 is then selectively etched to expose the doped silicon 32. As a still further alternative, the planarization etch can be continued until the doped silicon becomes exposed.

At this stage, the exposed doped silicon is removed by etching to leave only intrinsic silicon between the source and drain electrodes. This normally involves the removal of some, but not all of the intrinsic amorphous silicon in order to ensure that all of the doped amorphous silicon has been removed.

Figure 13:
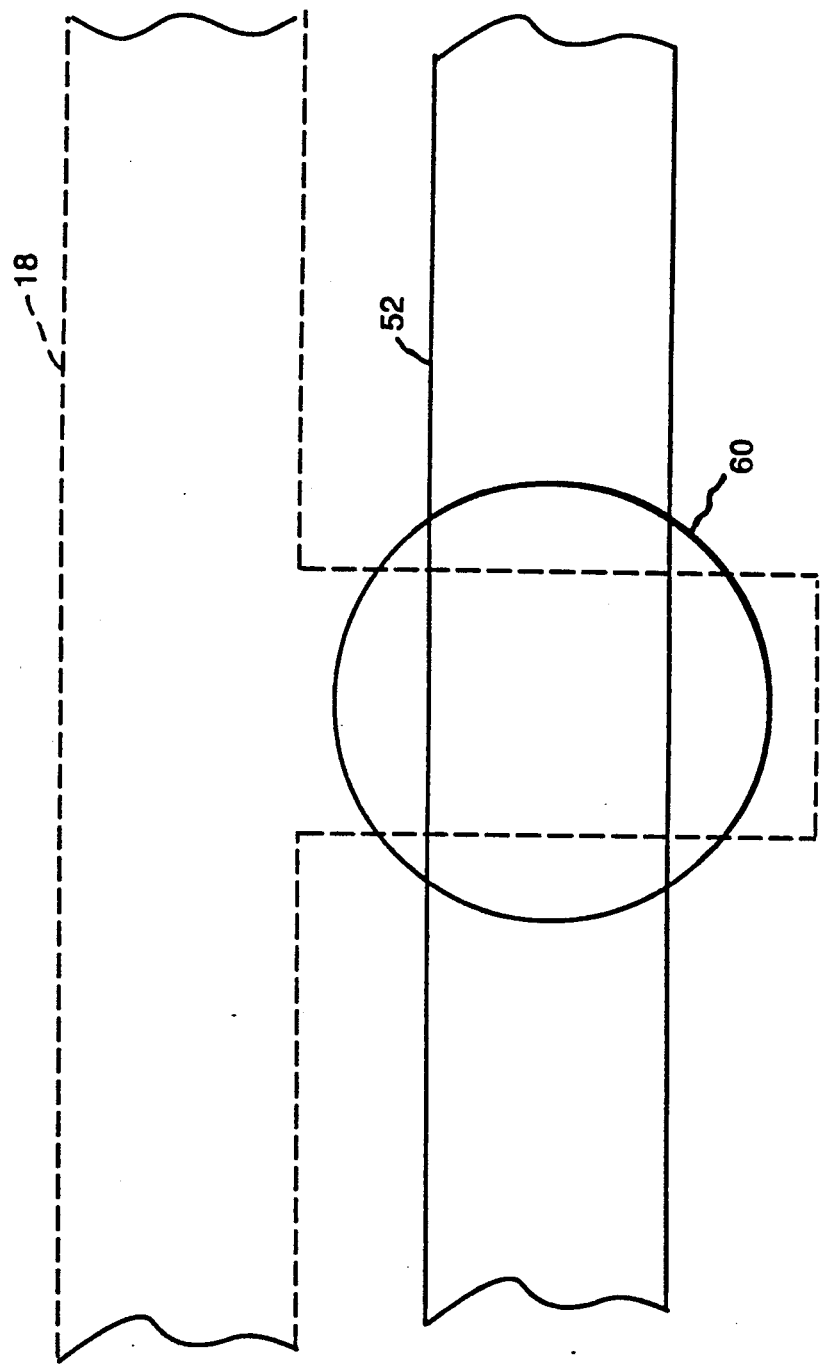
Figure 14:
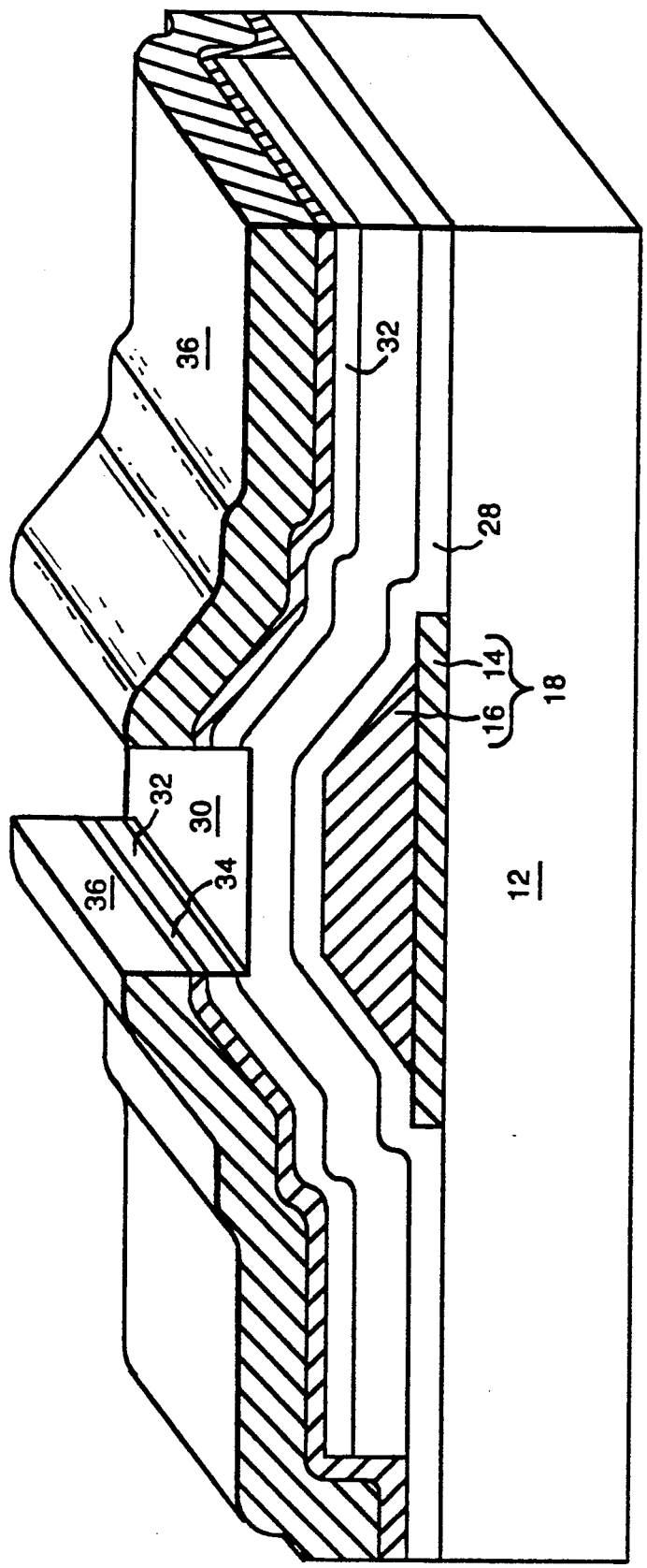

A key consideration is that the source/drain gap in the circle 60 in the top down view in FIG. 13 is disposed in proper alignment with the underlying gate electrode 18. Since the source/drain gap is defined by the self-aligned planarization method just described, control of the size of the source/drain gap and its location is independent of the alignment of the etching mask 52 which controls the pattern and location of the other portions of the boundary of the retained source/drain metallization.

If the silicon was not patterned previously it is usually necessary to remove excess silicon exposed after the removal of the source/drain metal. This etch is done with the source/drain mask still in place in order to protect the exposed silicon in the channel region.

The source and drain metallization is then patterned to provide the various desired segments of the source and drain metallization which connect to various devices and interconnect devices in a manner which is appropriate to the structure being fabricated. The etching of the pattern of the source/drain metallization may preferably be done in two stages using RIE with the appropriate source gases discussed above or it may be done by wet etching or other means. This yields the structure illustrated in FIG. 14.

Figure 15:
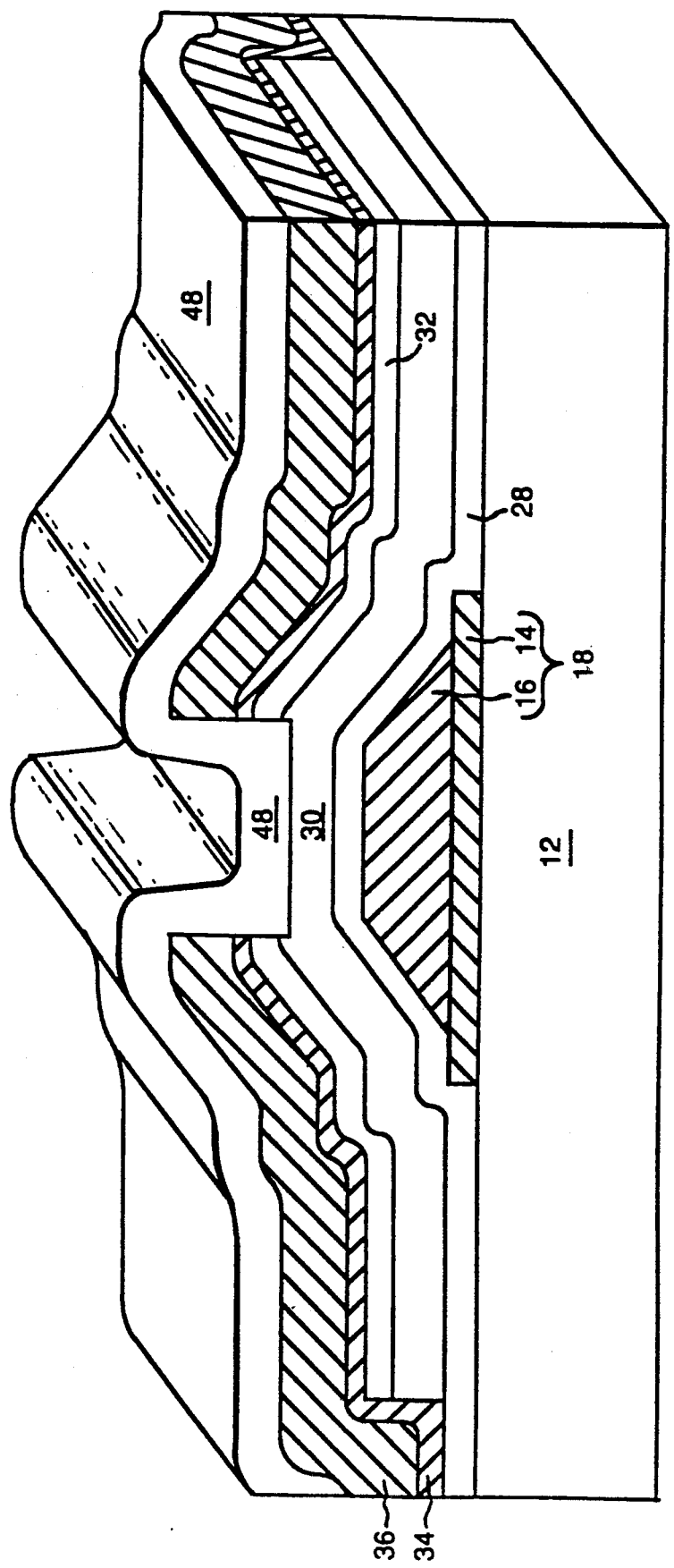
FIG. 15 is a perspective, partially cross-section view of the structure following formation of a passivation layer over the structure.

Thereafter, a passivation layer 48 may be deposited on the upper surface of the structure as shown in FIG. 15. This passivation layer is known as a back channel passivation layer since its purpose is to passivate the back or the away-from-the-gate-metallization surface of the silicon to maximize the stability of the device characteristics of this thin film transistor. This passivation layer is typically about 2,000 Å thick and may be silicon dioxide, silicon nitride or other insulators such as polyimide.

Typically, the illustrated thin film transistor is only one of many such thin film transistors which are simultaneously fabricated on the same substrate.

While the semiconductor material in the just described embodiment is amorphous silicon, since that is the material presently in typical use for thin film transistors, it should be understood that this process is equally applicable to the use of other semiconductor materials or other forms of silicon. Further, while the gate dielectric layer has been described as being silicon nitride, it will be understood that more than one sublayer may be present in the gate dielectric layer and various sublayers may have different compositions and a single layer dielectric may be $SiO_2$ or other dielectric materials.

Other semiconductor materials which are presently used in an amorphous condition are germanium and cadmium selenide. This process technique is applicable to those amorphous silicon semiconductor materials and any others as well as being applicable to polycrystalline or even monocrystalline semiconductor materials where the underlying support structure supports the formation of such semiconductor layers.

It will be recognized that the distance by which the upper gate layer 16 is setback from the edge of the lower gate layer 14 is controlled by the rate at which the upper gate layer etches back and the length of time for which that etch back is allowed to proceed. By appropriate control of the etch rate and time this setback can be varied over a substantial range, from a fraction of a micron to several microns or more as may be considered desirable in a particular device.

This provides the ability to controllably increase the degree of overlap between the gate electrode and the source and drain electrodes of self-aligned device produced in accordance with application Ser. No. 07/593,425, "Device Self-Alignment by Propagation of a Reference Structure's Topography". This technique is also applicable to the methods disclosed in related applications Ser. Nos. application Ser. No. 07/510,767, entitled, "Method for Photolithographically Forming a Self-Aligned Mask Using Back Side Exposure and a Non-Specular Reflecting Layer" and application Ser. No. 07/499,733, entitled, "Method for Fabricating a Self-Aligned Thin-Film Transistor Utilizing Planarization and Back-Side Photoresist Exposure", provided that the first gate metallization layer is made of a material which is transparent or sufficiently transmissive of the actinic light employed to expose the photoresist that 50 the photoresist can be exposed through the lower, thin, gate conductor and shadowed by the thick gate conductor in their self-aligned processes which expose the photoresist by directing the exposing radiation through the substrate as a means of establishing the channel region gap between the source and drain electrodes in a self-aligned manner. Transmission of the exposing (UV) radiation through the first, thin gate conductor layer may be provided by use of a conductor layer which is transparent to that light frequency or alternatively, by use of gate metallization material which is opaque to that light frequency, but whose thickness is kept below about 100 Å whereby a substantial portion of the actinic radiation incident thereon passes therethrough.

In this alternative process, the gate metallization pattern is fabricated in the same manner as described above and the device fabrication carried out in the manner described above through the deposition of the layer of intrinsic amorphous silicon. Next, a layer of dielectric material is deposited on that amorphous silicon layer. Then a positive photoresist layer is disposed on that layer of dielectric material, exposed to actinic radiation through the substrate and the underlying layers of the device being fabricated and developed. This leaves a plug of photoresist in alignment with the thick, upper conductor of the gate metallization. This plug is then used as a mask for the removal of the dielectric layer where it is not protected by the photoresist. This leaves a plug of the dielectric material disposed on the intrinsic amorphous silicon in alignment with the thick, upper gate conductor material. Since this plug is set back from the edge of the gate electrode (the outer edge of the lower thin gate conductor) and will eventually space the source and drain electrodes apart, the overlap between the source and drain electrodes and the gate is substantially greater than it is in those basic processes for the same photoresist exposure and development conditions. Consequently, there will in general be no need to overexpose or overdevelop the photoresist in order to increase that overlap between the gate electrode and the source and drain electrodes.

Next, a layer of n+ doped amorphous silicon is deposited over the dielectric plug and the exposed portions of the intrinsic amorphous silicon. The source/drain metallization is then deposited, a planarization layer such as photoresist is formed over the upper surface of the structure and that upper surface of the structure is uniformly etched in a non-selective manner until the source/drain metallization is exposed over the dielectric plug because of its greater height there. This exposed portion of the source/drain metallization may then be selectively etched to expose the n+ doped amorphous silicon which is disposed on the dielectric plug. The now exposed portion of the n+ amorphous silicon is then removed to expose the top of the dielectric plug to isolate the source and drain electrodes from each other in this region. The source/drain metallization layer is then further patterned to remove at least those portions which connect the source and drain electrodes to each other outside this portion of the structure. Alternatively, that patterning of the source/drain metallization may be done before deposition of the planarization layer. Any other steps necessary to the fabrication of the device are then carried out.

There are a number of other variations possible. The silicon could be left unpatterned. This results in intrinsic amorphous silicon and n+ amorphous silicon being left under the source/drain metallization in all places. For applications such as imagers this is acceptable. Just the intrinsic amorphous silicon could be patterned before the n+ amorphous silicon deposition and then the source/drain metallization deposited. This would result in n+ under the source/drain metallization in all places. This could be acceptable even for displays where the contact to the transparent electrode would then be metal/n+/transparent electrode.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a thin film transistor comprising the steps of:

depositing a first gate conductor layer on a major surface of a substrate;

depositing a second gate conductor layer over said first gate conductor layer, said second gate conductor layer being susceptible to etching under conditions under which said first gate conductor layer is substantially immune to etching;

providing a photoresist layer over said second gate conductor layer;

exposing and developing said photoresist in a pattern in accordance with a desired configuration of said first gate conductor layer;

etching said second gate conductor layer and said first gate conductor layer where they are not protected by the retained portion of said photoresist layer; then etching back, with an etchant to which said first gate conductor layer is substantially immune, said second gate conductor layer to expose peripheral portions of said first gate conductor layer in a self aligned manner so as to form a patterned gate electrode having a gate conductor topology wherein said second gate conductor layer has sloped sidewalls set back a selected overlap distance from sidewalls of said first gate conductor layer, said selected overlap distance corresponding to the exposed peripheral portions of said first gate conductor layer;

removing any remaining photoresist;

depositing over said substrate and said first and second gate conductor layers a substantially conformal gate dielectric layer, depositing over said gate dielectric layer a substantially conformal semiconductor material layer, and depositing over said semiconductor material layer a substantially conformal source/drain metallization layer such that said gate conductor topography is propagated upward through each of said layers;

applying a planarization layer over said source/drain metallization layer;

planarizing said planarization layer to expose at least a portion of said source/drain metallization layer disposed over and corresponding to an uppermost portion of said patterned gate conductor topography; and etching said source/drain metallization layer to form self-aligned source and drain electrodes disposed over said first gate conductor layer at least by said selected overlap distance.

2. The method recited in claim 1 wherein said first gate conductor layer is substantially transparent to at least one frequency in the infrared-to-ultraviolet portion of the electromagnetic spectrum.

3. The method recited in claim 1 wherein:
said semiconductor material is silicon.

4. The method recited in claim 1 wherein:
said semiconductor material is amorphous silicon.

5. A method of fabricating a thin film transistor comprising the steps of:
depositing a first gate conductor layer on a major surface of a substrate;

depositing a second gate conductor layer over said first gate conductor layer, said second conductor being susceptible to etching under conditions under which said first gate conductor layer is substantially immune to etching;

providing a photoresist layer over said second gate conductor layer;

exposing and developing said photoresist in a pattern in accordance with a desired configuration of said first gate conductor layer;

etching said second gate conductor layer and said first gate conductor layer where they are not protected by the retained portion of said photoresist layer; then etching back, with an etchant to which said first gate conductor layer is substantially immune, said second gate conductor layer to expose peripheral portions of said first gate conductor layer in a self-aligned manner so as to form a patterned gate electrode having a gate conductor topology wherein said second gate conductor layer has sloped sidewalls set back a selected overlap distance from sidewalls of said first gate conductor layer, said selected overlap distance corresponding to the exposed peripheral portions of said first gate conductor layer;

depositing a substantially conformal dielectric layer over said patterned gate conductor and exposed portions of said substrate upper surface;

depositing a substantially conformal layer of semiconductor material over said dielectric layer;

depositing a layer of source/drain metallization over said semiconductor material layer;

forming a planarization layer of a planarization material over the source/drain metallization, said planarization layer having a substantially planar exposed surface;

uniformly removing said planarization material until said source/drain metallization is exposed in alignment with raised portions of said second gate conductor layer; and selectively removing the exposed source/drain metallization to expose the underlying semiconductor material layer such that the remaining source/drain metallization is disposed over said patterned gate conductor by at least said selected overlap distance.

6. The method recited in claim 5 wherein:
the step of depositing the layer of semiconductor material comprises:
first depositing a layer of substantially undoped semiconductor material; and
second depositing a layer of doped semiconductor material; and
said method further comprises, after the step of selectively removing the source/drain metallization, the step of:
removing the doped semiconductor material portion of said semiconductor material layer.

7. The method recited in claim 6 wherein:
said semiconductor material is silicon.

8. The method recited in claim 7 wherein:
said semiconductor material is amorphous silicon.

9. The method recited in claim 5 wherein:
said semiconductor material is silicon.

10. The method recited in claim 9 wherein:
said semiconductor material is amorphous silicon.

11. The method recited in claim 5 further comprising the step of:
providing a back channel passivation layer over the structure.

12. The method recited in claim 5 wherein said first gate conductor layer is substantially transparent to at least one frequency in the infrared-to-ultraviolet portion of the electromagnetic spectrum.

13. A method of fabricating a thin film transistor comprising the steps of:
depositing a first gate conductor layer on a major surface of a substrate, said first gate layer being transmissive of at least one frequency of radiation capable of exposing photoresist;

depositing a second gate conductor layer over said first gate conductor layer, said second conductor layer being opaque to said at least one frequency of radiation and being susceptible to etching under conditions under which said first gate conductor layer is substantially immune to etching;

providing a photoresist layer over said second gate conductor layer;

exposing and developing said photoresist in a pattern in accordance with a desired configuration of said first gate conductor layer;

etching said second gate conductor layer and said first gate conductor layer where they are not protected by the retained portion of said photoresist layer; then etching back, with an etchant to which said first gate conductor layer is substantially immune, said second gate conductor layer to expose peripheral portions of said first gate conductor layer in a self-aligned manner so as to form a patterned gate electrode having a gate conductor topology wherein said second gate conductor layer has sloped sidewalls set back a selected overlap distance from sidewalls of said first gate conductor layer, said selected overlap distance corresponding to the exposed peripheral portions of said first gate conductor layer;

depositing a first substantially conformal dielectric layer over said patterned gate conductor and exposed portions of said substrate upper surface;

depositing a substantially conformal layer of semiconductor material on said dielectric layer;

depositing a second layer of photoresist on the second dielectric layer;

exposing a back-side substrate surface, opposite to said major substrate surface, to UV light for a selected duration, to cause exposure of at least a portion of the second photoresist layer outside of a shadow of the opaque portion of said gate electrode;

removing at least the exposed second photoresist portion by selective development, to form a mask for etching the second dielectric layer;

etching said second dielectric layer to remove the portions not protected by the retained portion of said second photoresist;

depositing a layer of doped semiconductor material on the exposed semiconductor portion and over the remaining portion of the second dielectric layer;

depositing a layer of source/drain metallization over said doped semiconductor material layer;

forming a planarization layer of a planarization material over the source/drain metallization, said planarization layer having a substantially planar exposed surface;

uniformly removing said planarization material until said source/drain metallization is exposed in alignment with raised portions of said patterned gate conductor; and selectively etching the exposed portion of the source/drain metallization and a portion of the doped semiconductor layer, to expose at least a top surface of the remaining portion of said second dielectric layer, and to form self-registered source and drain electrodes each of which overlaps the gate electrode at least by said selected overlap distance.

* * * * *